United States Patent [19]
Vitriol

[11] Patent Number: 5,315,239
[45] Date of Patent: May 24, 1994

[54] CIRCUIT MODULE CONNECTIONS

[75] Inventor: William A. Vitriol, West Lafayette, Ind.

[73] Assignee: Hughes Aircraft Company, Los Angeles, Calif.

[21] Appl. No.: 807,311

[22] Filed: Dec. 16, 1991

[51] Int. Cl.$^5$ .......................... G01R 31/02; H05K 1/03
[52] U.S. Cl. .................................. 324/158 F; 361/739; 361/792
[58] Field of Search ...................... 324/158 F; 361/393, 361/394, 396, 414, 739, 740, 792, 793, 795

[56] References Cited

U.S. PATENT DOCUMENTS

| | | | |
|---|---|---|---|
| 3,365,620 | 1/1968 | Butler et al. | 361/414 |
| 3,545,079 | 12/1970 | Kossar | 361/414 |
| 4,736,266 | 4/1988 | Tanibe | 361/414 |
| 4,899,118 | 2/1990 | Polinski, Sr. | 361/414 |
| 4,963,697 | 10/1990 | Peterson et al. | 361/414 |
| 5,028,473 | 7/1991 | Vitriol et al. | 361/398 |
| 5,111,003 | 5/1992 | Kimbara | 361/414 |
| 5,121,299 | 6/1992 | Frankeny et al. | 361/414 |
| 5,157,364 | 10/1992 | Pond et al. | 333/246 |
| 5,159,530 | 10/1992 | Komoto | 361/414 |
| 5,165,984 | 11/1992 | Schoenthaler | 361/414 |

Primary Examiner—Ernest F. Karlsen
Attorney, Agent, or Firm—Elizabeth E. Leitereg; Terje Gudmestad; W. K. Denson-Low

[57] ABSTRACT

Low temperature, co-fired ceramic (LTCC) modules (10, 80, 82, 110, 102, 140, 160) are interconnected to one another, stacked and automatically connected to other modules by rigid LTCC interconnecting modules (104), or provided with covers or hermetically sealed covers (130, 166) that automatically register and make electrical or mechanical connections between the cover and the protected module. The various types of connections are achieved by forming in the LTCC modules, during the lamination process, patterns of frictionally interfitting bumps (60, 62, 66, 84a, 84b, 84c) on one side and depressions (70, 72, 76, 81a, 81b, 81c) on the other, whereby a pattern of bumps on one side of one module will connect both mechanically and electrically to a mating pattern of depressions on the other module to stack and automatically lock vertical packages of LTCC modules. The concept is applicable to an LTCC test board (120) at which a module (124) to be tested may be registered and connected to a test board and then tested and readily removed without time consuming registration and connection, and allowing reuse of the test board.

14 Claims, 2 Drawing Sheets

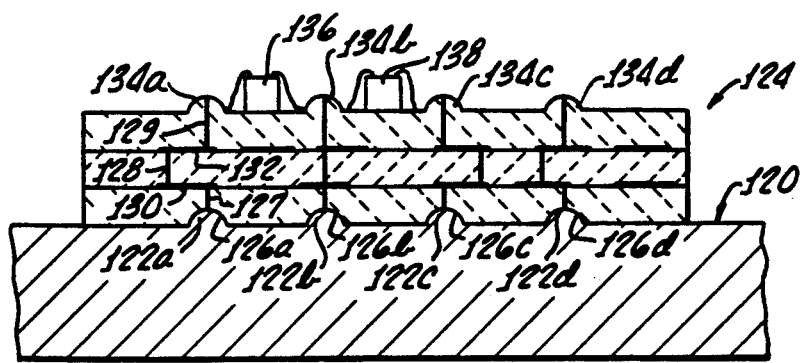
Fig. 4.
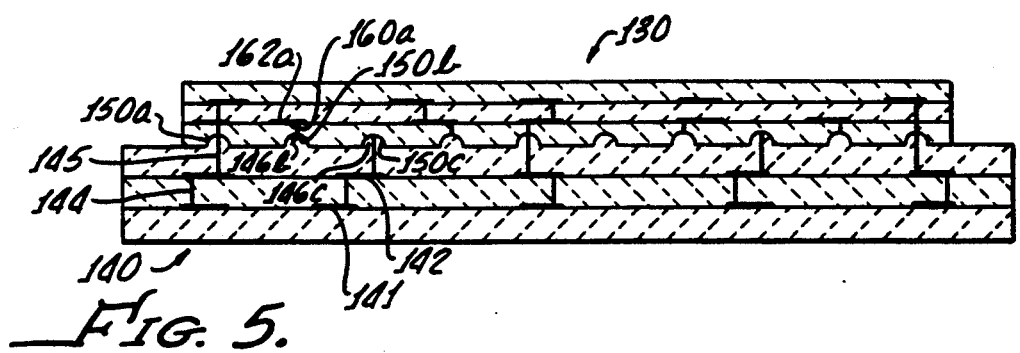
Fig. 5.
Fig. 6.
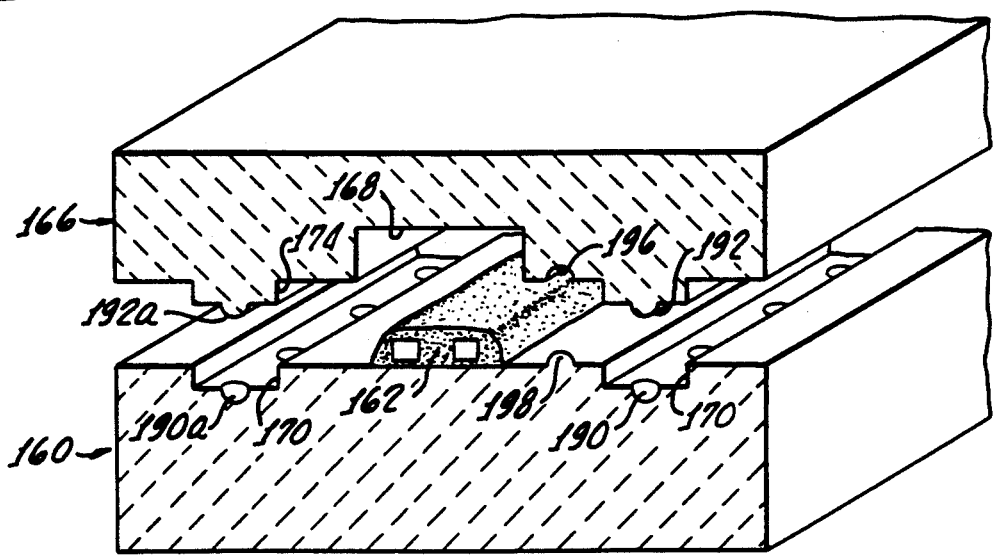

CIRCUIT MODULE CONNECTIONS

BACKGROUND OF THE INVENTION

1. Field of the Invention

The present invention relates to laminated multi-layer circuit modules or packages and more particularly concerns electrical or mechanical interconnection of such modules.

2. Description of Related Art

Multi-layer electronic circuitry is often fabricated in the form of individual modules bearing various types of internal circuitry and having components mounted on or connected thereto. At times it is necessary to connect one or more of such modules to other circuitry or to each other, or to provide a protective cover for such of those modules that have components such as IC chips and the like surface mounted thereon. Frequently it is desirable to cover the surface mounted components and hermetically seal the multi-layer module.

Modules have been interconnected by soldering two or more together, or by the use of separate connection components, such as flexible cables or other cable connectors which must be separately fabricated and individually connected to the individual modules. Such types of connections are effective, but relatively expensive, time consuming to fabricate and connect, and in some forms may not provide rigid mechanical connection of the modules.

Prior techniques for interconnection of such modules do not readily lend themselves to efficient and economic interconnections for test probe connections and disconnections, nor for stacking of a group of modules to afford compact packaging.

Accordingly, it is an object of the present invention to provide for electric circuit module interconnection by techniques and means that avoid or minimize above mentioned problems.

SUMMARY OF THE INVENTION

In carrying out principles of the present invention a high density electronic circuit package includes first and second modules which respectively have patterns of interfitting metallized discontinuities such as protrusions and depressions in adjoining surfaces. The protrusions of one module are received in the depressions of the other module, and thereby mechanically and electrically interconnect the two modules while providing automatic registration of one with the other. The interfitting patterns of protrusions and depressions allow a number of modules to be vertically stacked, automatically registered and mechanically and electrically interconnected. The same techniques allow two modules to be connected by a third bridging module which has different portions thereof connected to the first two by the described interengaging protrusions and depressions. Still further, an hermetically sealed cover can be connected to protect an underlying module by means of such protrusions and depressions, or, in an alternate embodiment, may be connected and hermetically sealed to the underlying module by means of continuous perimetric tongue projected into and sealed within a continuous perimetric groove in the underlying module.

BRIEF DESCRIPTION OF THE DRAWINGS

In the accompanying drawings:

FIG. 4 shows a module temporarily interconnected to a test board;

FIG. 5 shows a multi-layer circuit module package with a protective cover attached thereto; and FIG. 6 shows use of tongue and groove interconnections for sealing a cover to a module.

DESCRIPTION OF THE PREFERRED EMBODIMENTS

Figure 1:
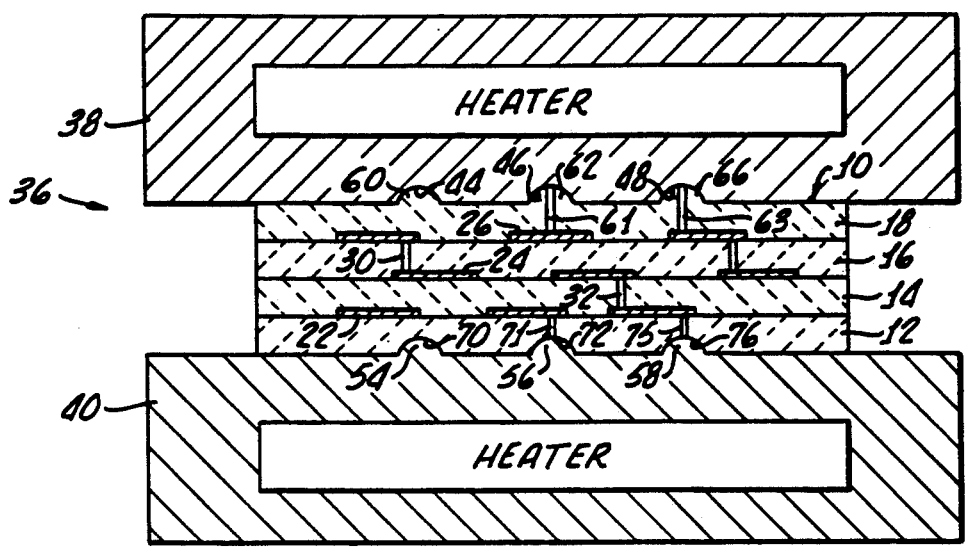
FIG. 1 illustrates a single module being laminated in a heated press.

Principles of the present invention are applicable to many different types of multi-layer electrical circuit boards or circuit modules which may need to be interconnected. The procedures to be described herein have been developed initially for application to low temperature, co-fired ceramic (LTCC) modules, and accordingly, for purposes of exposition, will be described in connection with application to such modules.

Low temperature, co-fired ceramic modules are multi-layer circuits formed of ceramic sheets imprinted with various circuit layers. No substrates, per se, are employed, nor is there any fired rigid ceramic used in the layers. In the manufacture of low temperature, co-fired ceramics a dielectric powder, such as borosilicate glass, is mixed with various organic materials, such as acrylic resins, such as that known as Elvacite, and cast or coated in sheets on a carrier where it is allowed to dry, after which it is cut into tape strips. Such strips may have a thickness of between $4\frac{1}{2}$ to about 12 mils when dry. Suitable holes are punched in the tape strips for vias and registration pins, and the via holes are then filled with an electrically conductive "via fill". Circuit traces or conductors are then printed upon the strips, employing standard thick film screen printing techniques, with such circuits being individually printed on each of a number of different tape sheets. The first and last layers of any stack of layers of sheets may have the circuitry printed on both sides.

The tape sheets are then stacked and aligned by means of registration pins on a registration fixture extending through the registration holes in the tape. This provides an assembly of alternating layers of circuitry and interposed dielectric tape sheets. While held in laminated registration, the stack is heated to a suitably high temperature under high pressure, such as 70° C. and as much as 3,000 psi for about ten minutes. The thermo-plastic organic materials in the tape soften and, under the pressure, flow together to effectively mechanically weld the individual sheets into a monolithic structure or a single laminated part. The resulting part is much like a single thick slab and may have a total thickness of up to 120 mils, with a number of different circuit layers buried within the body and the several layers electrically interconnected by the conductive vias that have been formed in the individual tape sheets.

The resulting module may be employed in many different manners. It may have various components, IC chips and the like, mounted on the top of the module, and may be provided with wire bond pads or other connector pads, whereby components may be surface mounted and bonded or otherwise connected to the pads of the module. Such a module may be connected to other modules by any typically known connection techniques presently used for standard hybrid microelectronic connection technology, with all of the drawbacks and limitations of such prior connection techniques, as described above.

In accordance with a feature of the invention, many disadvantages of prior connection techniques are avoided or minimized by module interconnection features that are formed when the multi-layer assembly is heated under pressure. These features are formed when the laminated stack of printed ceramic tape sheets is heated under pressure in a press, such as an embossing press in the manner illustrated in FIG. 1, to define a selected pattern of protrusions or bumps on one side of the module and a selected pattern of depressions on the other side of the module.

As schematically shown in FIG. 1, a single exemplary LTCC module is generally indicated at 10, and, in this instance, includes four sheets of ceramic tape 12,14,16 and 18, of which sheets 12, 14 and 16 are shown in this figure as bearing layers of circuit traces 22, 24 and 26, some of which are connected by metallized vias, such as those shown at 30, 32, 61, 63, 71 and 75 in FIG. 1. Schematically indicated in FIG. 1 is a heated press 36, having a top die 38 and a bottom die 40. The top die of the press is formed with a pattern of discontinuities, such as depressions 44, 46, 48, etc., whereas the bottom portion of the press 40 is formed with a pattern of discontinuities, such as protrusions or bumps 54, 56, 58, etc.

This press is employed to perform the usual operations of heating and pressing the stacked registered layers (registration pins of the stack are not illustrated in the figure for convenience and clarity of the drawings).

Uniquely, in accordance with principles of the present invention, while the lamination under heat and pressure takes place, the use of the depression and protrusion pattern of the embossing type dies forms the desired patterns of interfitting and interconnecting discontinuities on opposite surfaces of the module. Thus the depressions 44,46,48 of the top section 38 of the die form protrusions 60,62,66 in the upper surface of the module, whereas the bumps 54, 56, 58 of the lower part of the die form depressions 70, 72, 76 on the lower surface of module 10.

After lamination the part is heated, typically to 400° C. for two hours to accomplish a burnout that vaporizes and removes the organic material that gives the tape initial flexibility. Subsequent or concomitant high temperature firing to typically 850° C. causes the ceramic film to flow to fuse the dielectric into a dense glass ceramic matrix, with the metallizations of the circuitry and vias fusing to the dielectric. The entire structure shrinks volumetrically under the heat and pressure, and thereafter, upon removal from the furnace, surface mounted components and other attachments may be applied as desired.

The protrusions and depressions formed in the module surfaces in this manner may be selectively metallized, preferably before removal of the module from the press, by various techniques well known to those skilled in the art, including both thick and thin film deposition techniques and the like. For example one or more bumps 60, 62 and 66 is provided with an external metal surface coating for connection to some external device. Correspondingly, one or more of the depressions 70,72,76 is coated with a metallization layer for connection to some exterior device. These metallic surface coatings may also connect to internal metallized vias, such as vias 61, 63, 71, 75, that extend to the module outer surfaces at the respective protrusions 62,66 and depressions 72,76, for example.

The protrusion and depression bearing module may be stacked together with one or many more similar modules bearing interfitting patterns of similar protrusions and depressions on opposite sides thereof. At least some of the protrusions and depressions form patterns or sub-areas of patterns that will mate with sub-areas of patterns of corresponding depressions and protrusions on adjoining modules.

Figure 2:
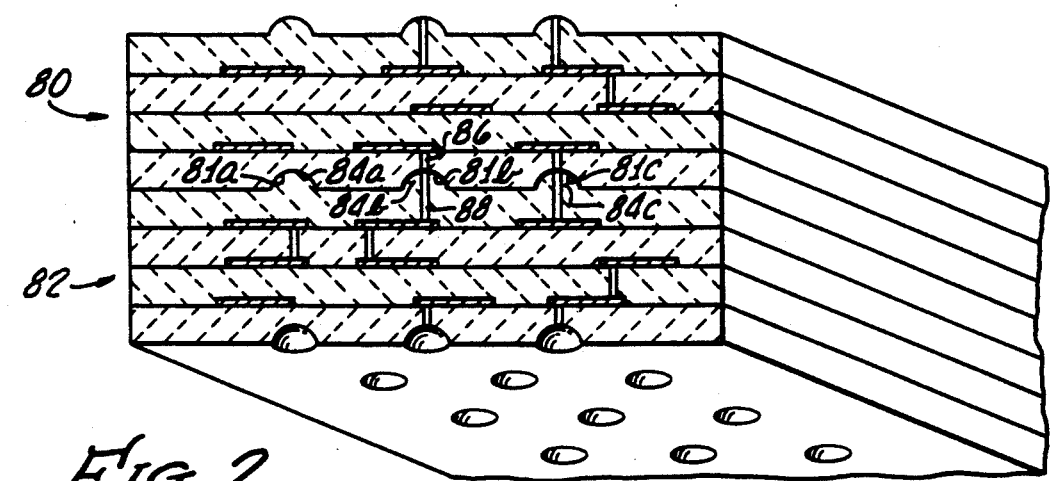
FIG 2 is a pictorial illustration of parts of two multi-layer modules interconnected in accordance with principles of the present invention.

FIG. 2 illustrates two such modules of a stack of many modules stacked upon one another, with an upper module 80 being stacked upon a lower module 82. Depressions, such as depressions 81a, 81b and 81c on the lower side of upper module 80, receive bumps, such as bumps 84a, 84b and 84c on the upper side of the lower module 82. Those protrusion and depression pairs that are metallized and connected to internal vias, such as depression 81b connected to a via 86, and protrusion 84b connected to a via 88, provide an electrical interconnection point between the two modules. The protrusion and depression patterns which mate with one another also provide automatic registration of the relative positions of the two modules with respect to one another. Further, the bumps and depressions may be configured and arranged to snap together with a friction fit so that frictional engagement between all or groups of protrusions of one module and all or groups of depressions of the other will mechanically hold the two modules together so that they must be forced apart to disengage the mechanical frictional interconnection. Accordingly, it will be seen that the provision of the mating patterns of depressions and protrusions not only provides automatic registration of one module with another, but also provides both electrical and mechanical interconnection. The mechanical interconnection is readily detachable but may be made permanent simply by soldering or otherwise bonding the two modules together. For example, a solder cream or solder paste can be selectively coated on the upper ends of the protrusions 84a, 84b and 84c, and a similar coating formed on the bottom of depressions 81a, 81b and 81c, so that after the modules have been registered and snapped together, application of heat will cause the solder to flow and permanently lock the two modules together. Solder connections can be employed at other areas of the modules, as deemed necessary or desirable.

Following principles illustrated in FIGS. 1 and 2, a group of as many as two to ten or more modules may be vertically stacked, automatically registered and automatically interconnected electrically and mechanically.

Figure 3:
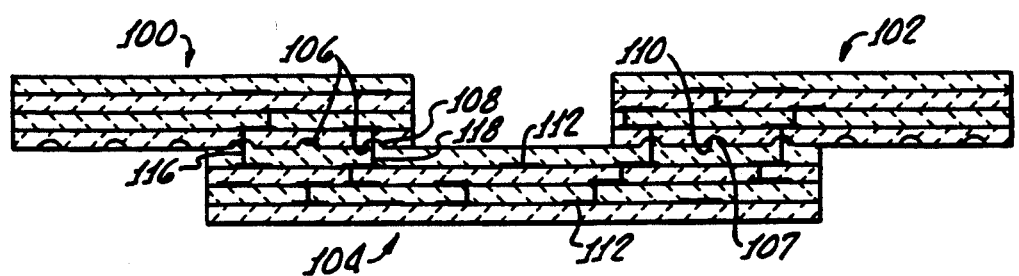
FIG. 3 illustrates an interconnect module connecting two other modules.

The inter-module interconnecting bumps (protrusions) and dimples (depressions) illustrated in connection with FIGS. 1 and 2 may be applied to interconnect two multi-layer circuit modules, such as two LTCC modules 100 and 102, as illustrated in FIG. 3. In this arrangement modules 100 and 102 may be formed only with the desired patterns of either bumps or depressions on a lower corresponding surface of each. A third module in the form of a rigid multi-layer interconnecting board 104 is formed with a first pattern of either depressions or bumps 108 on an upper surface that mate with and are received in a sub-pattern of the depressions 106 on the under surface of module 100. Similarly, at the other side of the rigid interconnect board 104 is formed a pattern 107 of bumps that mate with and interconnect with a sub-pattern of depressions 110 on one portion of the second module 102. The interconnect board itself may be an LTCC multi-layer module having circuit trace layers generally indicated at 112,114, and interconnecting vias such as those indicated at 116,118.

Illustrated in FIG. 4 is an example of application of the multi-layer module interconnection techniques described herein to module testing. A circuit test board 120 may be of any type of construction, including multi-layer construction having various circuitry or components for connection to test fixture circuits. Test board 120 is formed with a plurality of bumps 122a, 122b, 122c and 122d arranged in a predetermined pattern of such bumps. An LTCC module, such as module 124, to be tested is formed with a mating pattern of depressions 126a, 126b, 126c and 126d, which are metallized, as are the test board bumps 122a, 122b, 122c, 122d, and connected by various electrically conductive vias, such as vias 127, 128, 129 and circuit layers 130, 132, to circuit pads or metallized bumps 134a, 134b, 134c and 134d on the upper surface of the LTCC module under test. IC chips, indicated generally at 136 and 138, may be surface mounted to the LTCC module and connected via wire bonds to various connecting pads on the module and to other circuits.

In use of the described test board to test module 124, it is only necessary to physically place the module down upon the test board so as to automatically register the module with the board. The frictionally interfitting protrusions and depressions mechanically interconnect and lock the module to the test board, and simultaneously electrically interconnect the two. If deemed necessary or desirable, conventional clamping arrangements may be used to temporarily lock the module to the test board. After tests on the LTCC module are carried out, the friction type connection between the test board and the module is forcibly disengaged, and any other type of holding device which may be used (such as bolts or clamps, not shown) is removed to allow removal of the tested module.

FIG. 5 shows still another application of principles of the multi-layer interconnections described herein for use in applying a protective cover 130 to a multi-layer monolithic module 140. Module 140 may be a conventional multi-layer LTCC circuit module having various circuit layers 141,142 interconnected by vias 144,145 to a series of bumps such as bumps 146a, 146b and 146c, etc. formed on the upper surface of the LTCC module 140. A module cover 130, which itself may be a multi-layer LTCC module in order to take advantage of the area within the base of the cover, is provided with a plurality of mating depressions or recesses 150a, 150b, 150c, etc. metallized and connected by means of vias 160a and circuit traces 162a, to circuitry in the multi-layer LTCC module 140. The bumps and depressions may be metallized as previously described or may be coated with solder, which is then heated and flowed to fixedly secure and seal the cover to the lower module 140. By providing additional circuitry within the cover higher density packaging is obtained.

To provide an improved hermetic seal for an LTCC module and ensure electrical connection between circuitry in the cover and lower module, such as module 160, the arrangement of FIG. 6 may be employed. In this exemplary arrangement the module package 160 includes a plurality of layers of circuitry interconnected by various vias (not shown), and having at least one surface mounted component 162 mounted on and protruding well above its surface. Other circuitry (not shown) may be formed on the upper surface of LTCC module 160. To protect the surface mounted component 162 and to hermetically seal the upper surface of the module 160 and component 162, there is provided a cover module 166, which itself may be another multi-layer LTCC module. The cover module is formed with a cavity 168 that receives the surface mounted component or components 162. Conversely, the component may be mounted in a cavity in lower module 160 and the cover can have a flat surface. For interconnection and hermetic sealing of the cover 166 to the module package 160, a continuous perimetric tongue and groove interconnection is provided. The surfaces on both the tongue and groove may be metallized with a solderable conductor. Thus, for example, a continuous, generally rectangular cross section groove 170 is formed in the upper surface of module 160, extending continuously around the upper surface just inwardly of the outer edges of the module. A mating continuous tongue 174 is formed in the lower surface of cover 166 and is dimensioned, configured and arranged to be received as a snug fit within the continuous groove 170. Only the horizontal portions (as viewed in FIG. 6) of the tongue and groove may be coated with a suitable bonding agent or conductive solder cream or paste. With the cover 166 and module 160 having their tongue and groove mated, and with the tongue seated fully within the groove, the assembly is heated to hermetically seal the two together. If deemed necessary or desirable, depressions and bumps 190, 192, 190a and 192a may be formed on the mating ends of the grooves and tongues, such depressions and bumps being mutually spaced (e.g. not continuous) along the length of the grooves and tongues. These depressions and bumps may be metallized to achieve electrical interconnection between the hermetic sealing cover and the protected module 160 and to provide automatic registration between the cover and the module. The perimetric tongue and groove arrangement is preferred for those modules where areas of the modules inwardly of the exterior edges may not be available for formation of bumps or depressions because of the mounting of other components, such as component 162. Nevertheless, it may still be appropriate to provide certain smaller areas of depressions 196 and bumps 198 within the space circumscribed by the tongue and groove, or wherever space is available for the purpose of further registering, mechanically connecting and electrically interconnecting the cover and its protective module. The tongue and groove are formed in the same manner as are the protrusions and depressions, by pressing the stacked layers between heated dies having appropriately configured groove and tongue formed therein.

There have been described improved techniques for using bumps and depressions to stack, automatically register and lock multi-layer LTCC modules together, to horizontally interconnect and bridge two or more such modules, and further to readily connect and disconnect such a module to a universal LTCC test board to which the module may be quickly locked, registered, tested and removed. No hard, permanent connections are required, and the various interconnections can be made and re-made. The arrangement allows modules to be stacked vertically in very small volumes, and, furthermore, eliminates use of wire cable or bonded module to module interconnection devices.

The disclosure also includes the improved attachment of a ceramic lid to an LTCC module, ensuring electrical contact from substrate to lid and also providing an hermetic sealing arrangement. Because electrical contact is maintained, the lid itself can contain electrical circuitry, thus increasing circuit density. Use of the perimetric tongue and groove in the package base and lid provides an hermetic package of great strength. The interconnected lid and base are self-aligning and self-registering, as previously described. The bumps and depressions may be formed in a press, or the package base then may be laminated against a metal plate formed with an appropriate pattern of bumps or depressions.

It will be readily understood that the sizes and shapes of the protrusions and depressions, and, indeed, the particular patterns in which they are arrayed, may vary in many different arrangements as deemed necessary or desirable. An exemplary pattern of such an array has a pitch of between 5 and 25 mils. For example, the several depressions or several bumps of any one pattern are spaced in an even rectangular array with the bumps having a diameter of 5 mils and spaces between bumps being 5 mils, for a 10 mil pitch. The height of the bumps or depth of depressions in such an arrangement is about 5 mils. Preferably the configurations of the bumps and dimples, and the shape and slope of their tapered walls is selected to provide the desired amount of tightness of the interlocking frictional fit between them.

What is claimed is:

1. An electronic circuit package comprising:
   first and second modules each having opposite connecting surfaces, at least a part of one of said connecting surfaces of one of said modules being contiguous to at least a part of one of said connecting surfaces of the other of said modules, said modules each being a low temperature co-fired ceramic (LTCC) monolithic structure comprising:
   a plurality of cofired ceramic dielectric layers in a stacked assembly, and
   a conductive pattern on one surface of some of said plurality of dielectric layers such that said conductive patterns are separated by said dielectric layers in said stacked assembly,
   the other of said connecting surfaces of each module being on opposite sides of said stacked assembly, and said connecting surfaces having co-fired mating features therein,
   wherein said first module has said mating features comprising a first pattern of protrusions projecting from one of its connecting surfaces,
   said second module has said mating features comprising a second pattern of depressions in one of its connecting surfaces, said patterns having at least pattern portions in mating engagement with each other, with protrusions of said portions of said first pattern being received in depressions of said portions of said second pattern, and
   wherein said opposite connecting surface of at least one module has the other of protrusion and depression mating features for making electronic circuit package connections.

2. The package of claim 1 wherein said protrusions and depressions are configured and arranged to register said modules to one another.

3. The package of claim 1 wherein said protrusions and depressions are configured and arranged to connect said modules to one another electrically.

4. The package of claim 1 wherein said protrusions and depressions are configured and arranged to connect said modules to one another mechanically.

5. The package of claim 1 wherein said patterns are a mechanical snap fit with one another to physically connect the modules to each other.

6. The package of claim 1 wherein said engaging patterns include pairs of protrusions and depressions that are electrically interconnected.

7. The package of claim 1 wherein said patterns are formed by arrays of protrusions and depressions of which at least some are metallized and electrically interconnected.

8. The package of claim 1 wherein said first module comprises a cover for protection of said second module.

9. The package of claim 8 wherein said first pattern of protrusions comprises a continuous tongue extending around the perimeter of said first module, and wherein said second pattern comprises a continuous groove extending around the perimeter of said second module, said groove receiving said tongue in sealing relation to seal said cover to said second module.

10. The package of claim 1 wherein both said modules include circuit layers, wherein said patterns are a friction fit with one another and at least some mating pairs of depressions and protrusions are metallized and connected electrically to circuit layers in the respective modules.

11. The package of claim 1 including a third module, said third module having a connecting surface with a third pattern of depressions projecting therefrom, said third pattern depression being in mating engagement with a portion of the first pattern of protrusions on said first module, said first moduler bridging between said second and third modules to provide a physical and electrical interconnection therebetween, at least some of said depressions and protrusions having conductive surfaces to provide electrical connections.

12. The package of claim 1 wherein said first module comprises a circuity test board and said second module comprises a circuit module to be tested, and wherein said first and second modules are electrically secured to each other.

13. The package of claim 3 wherein said protrusions of one said module physically snap-fit into said depressions of the other said module to further mechanically connect said modules together.

14. The package of claim 4 wherein said protrusions of one said module snap-fit into said depressions of the other said module to mechanically connect said modules together.

* * * * *